US008535503B2

(12) United States Patent
Nowodzinski et al.

(10) Patent No.: US 8,535,503 B2
(45) Date of Patent: Sep. 17, 2013

(54) DEVICE WITH INTERMITTENT CONTACT IMPROVED BY DIELECTROPHORESIS

(75) Inventors: Antoine Nowodzinski, Saint-Ismier (FR); Vincent Mandrillon, Lans en Vercors (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 218 days.

(21) Appl. No.: 13/219,943

(22) Filed: Aug. 29, 2011

(65) Prior Publication Data

US 2012/0048736 A1 Mar. 1, 2012

(30) Foreign Application Priority Data

Aug. 27, 2010 (FR) ...................................... 10 03461

(51) Int. Cl.

| | |
|---|---|
| ***G01N 27/26*** | (2006.01) |
| ***H01L 41/04*** | (2006.01) |
| ***H01G 5/16*** | (2006.01) |
| ***H01H 57/00*** | (2006.01) |
| ***H01H 59/00*** | (2006.01) |

(52) U.S. Cl.
USPC ........... 204/643; 204/547; 204/600; 361/290; 200/181; 335/78

(58) Field of Classification Search
USPC ......... 204/547, 600, 643; 200/181; 361/290; 335/78
See application file for complete search history.

(56) References Cited

U.S. PATENT DOCUMENTS

| | | | | |
|---|---|---|---|---|
| 3,953,693 | A | 4/1976 | Pflanz | |
| 2007/0018761 | A1 * | 1/2007 | Yamanaka et al. | 335/78 |
| 2008/0017489 | A1 * | 1/2008 | Kawakubo et al. | 200/181 |
| 2008/0078662 | A1 | 4/2008 | Naito et al. | |
| 2008/0283374 | A1 * | 11/2008 | Naito | 200/181 |
| 2009/0135541 | A1 * | 5/2009 | Kawakubo et al. | 361/290 |
| 2012/0031744 | A1 * | 2/2012 | Naito et al. | 200/181 |

FOREIGN PATENT DOCUMENTS

| | | | |
|---|---|---|---|
| EP | 1 387 380 | A1 | 2/2004 |
| EP | 1 677 328 | A1 | 7/2006 |
| WO | WO 98/34269 | A1 | 8/1998 |

* cited by examiner

*Primary Examiner* — J. Christopher Ball
*Assistant Examiner* — Jennifer Dieterle
(74) *Attorney, Agent, or Firm* — Oliff & Berridge, PLC

(57) ABSTRACT

The device comprises first and second contact pads having a contact surface. The first and second contact pads move with respect to one another between an ohmic contact position between these contact surfaces and another position. The device further comprises means for applying a non-uniform electric field around the first contact pad. The electric field has a component in a direction parallel to the contact surface of the first contact pad. A fluid with a first dielectric permittivity value is arranged between the first contact pad and the decontamination electrode. The decontamination device and the fluid are configured in such a way that the electric field generates a force directed towards the decontamination electrode on a contaminant, by dielectrophoresis.

17 Claims, 2 Drawing Sheets

DEVICE WITH INTERMITTENT CONTACT IMPROVED BY DIELECTROPHORESIS

BACKGROUND OF THE INVENTION

The invention relates to a device comprising at least a first and second contact areas having a contact surface and moving with respect to one another between a common contact position of said contact surfaces and another position.

STATE OF THE ART

Micro electromechanical systems (MEMS) have been developed over the past years and are now present in a very large number of technological sectors.

Integration of these devices as close as possible to electronic chips makes for a gain in compactness and in consumed energy which paves the way for new applications and new markets.

However, like all moving mechanical parts, micro electromechanical systems are subject to a downfall of their performance with time. In a device of switch type, an intermittent electric contact is made between two contact pads.

As illustrated in FIG. 1, the switch comprises a substrate 1 provided with an integrated moving arm 2. Substrate 1 comprises a first contact pad 3 associated with a first electrode. Moving arm 2 comprises a second contact pad 4 associated with a second electrode. Second contact pad 4 moves between an insulating position and an electric contact position with the first contact pad 3.

Problems of reliability of the ohmic contact have arisen, in particular due to organic contaminants, resulting in a decrease of the performances of the switch with time. It is then necessary to replace the component or even a whole set of parts if the latter are indissociable, which may be problematic if the device is not easily accessible or if the device operates in a vacuum.

SUMMARY OF THE INVENTION

It is observed that a requirement exists to provide a device even equipped with an intermittent electric contact that presents a good resilience in time and production of which is easy to implement.

This requirement is tended to be met by means of a device according to the appended claims and more particularly by providing for the device to comprise

- a substrate equipped with a first contact pad with a contact area,
- a second contact pad integral to the substrate and comprising a contact area, the second pad moving with respect to the first contact pad between an ohmic contact position between said contact areas and another position,
- a decontamination device by application of a first non-uniform electric field over at least a part of the contact area of the first pad by means of a decontamination electrode,
- a fluid arranged between the first contact pad and the decontamination electrode, the fluid having a first dielectric permittivity value, a device wherein the decontamination device and the fluid are configured in such a way that the first electric field generates a force on a contaminant, by dielectrophoresis, directed towards the decontamination electrode.

This requirement is also tended to be met by providing for the device to comprise

- a substrate equipped with a first contact pad with a contact area,
- a second contact pad integral to the substrate and comprising a contact area, the second contact pad moving with respect to the first contact pad between an ohmic contact position between said contact areas and another position,
- a decontamination device by application of a first non-uniform electric field between a decontamination electrode and an additional electrode, the decontamination electrode and the additional electrode each surrounding the first contact pad, the decontamination device being configured in such a way that the first electric field comprises diverging or converging electric field lines in the direction of the additional electrode with an electric field gradient increasing or decreasing in the direction of the decontamination electrode along the surface of the substrate separating the decontamination electrode from the additional electrode.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

Figure 1:
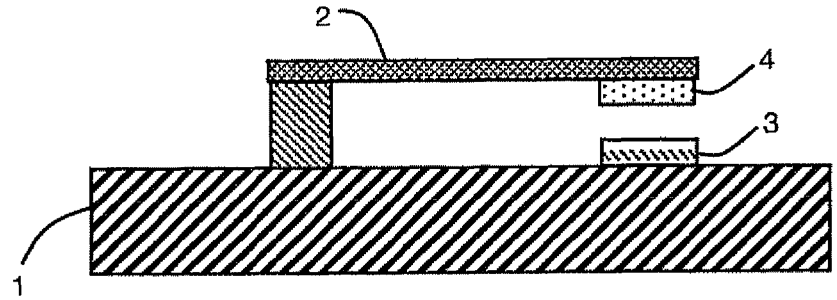
FIG. 1 illustrates a switch in schematic manner in cross-section.
Figure 2:
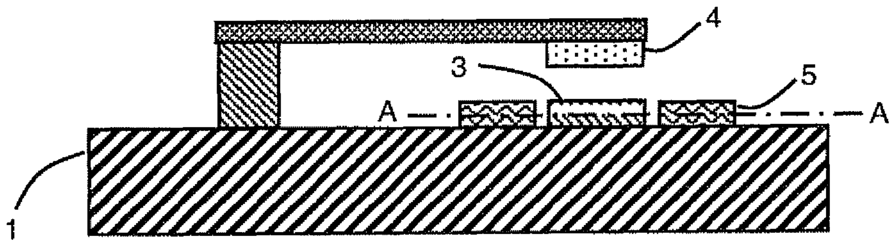
FIG. 2 illustrates a switch provided with an additional decontamination electrode in schematic manner in cross-section.

As illustrated in FIG. 2, the device comprises a substrate 1 provided with an integral moving arm 2. Substrate 1 comprises a first contact area 3, corresponding in this example to a contact pad, associated with a first electrode. Moving arm 2 comprises a second contact area 4 which also corresponds in this example to a contact pad and which is associated with a second electrode. Second contact pad 4 moves between a contact position with first contact pad 3 and another position, for example a rest position or a contact position with another contact pad. In another embodiment that is not represented, the position of first 3 and second 4 contact pads is reversed.

In general manner, first 3 and second 4 contact pads are movable with respect to one another and comprise at least one common contact position. First 3 and second 4 contact pads each have a contact surface and the common contact position corresponds to electric and physical connection between these two contact surfaces. The contact surface can be a flat surface or a convex surface. An ohmic contact is obtained in order to make an electric signal transit, i.e. an electric current flows between the two pads 3 and 4.

Figure 3:
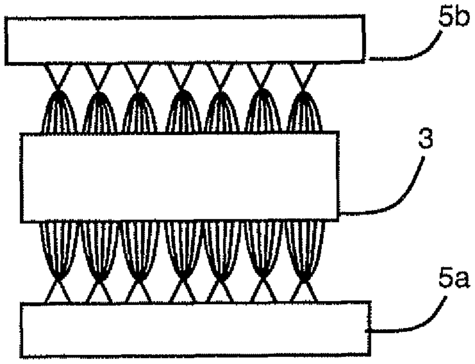
FIGS. 3 and 4 illustrate two decontamination electrodes and a surface contact with a part of the field lines present, in schematic manner, in top view and in bottom view.
Figure 4:
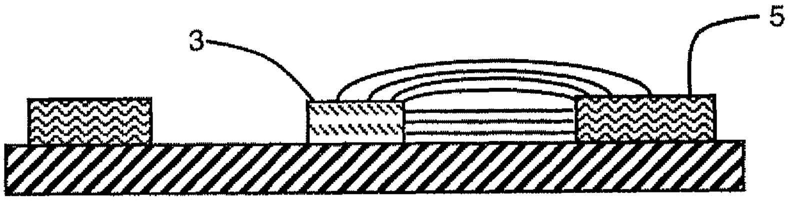

As illustrated in FIGS. 3 and 4, the device also comprises a device for generating a first non-uniform electric field on at least a part of the surface of an area to be decontaminated. This area to be decontaminated can be a first part of the contact surface of first contact pad 3, the whole contact surface or a surface adjacent to the first contact pad, for example an area more or less completely surrounding the first contact pad to prevent contamination from reaching contact pad 3.

A fluid, for example a gas or a liquid, is arranged between first contact pad 3 and decontamination electrode 5. The fluid has a first dielectric permittivity value and is subjected to the electric field generated between the contact pad and decontamination electrode. Fluid can partially or completely cover contact pad 3 and/or decontamination electrode 5.

The decontamination device applies the first non-uniform electric field on at least a part of the contact area of first pad 3, i.e. the area to be decontaminated, by means of decontamination electrode 5. The decontamination device and the fluid are configured in such a way that the electric field generates a force on the contaminants directed towards decontamination electrode 5, by dielectrophoresis.

In this way, the contaminants located in the electric field and in the fluid are moved so as to decontaminate contact pad 3 or the area of contact pad 3 to be decontaminated.

When the space located between first pad 3 and decontamination electrode 5 is filled by a fluid having a lower permittivity than the supposed contamination permittivity, the field lines are configured diverging in the direction of first pad 3.

When the space located between first pad 3 and decontamination electrode 5 is filled by a fluid having a higher permittivity than the supposed contamination permittivity, the field lines are configured converging in the direction of first pad 3.

The device for generating the first electric field enables a non-uniform electric field to be obtained, which results in the existence of an electric field gradient in the area to be decontaminated. This electric field gradient attracts the dielectric particles from the low electric field gradient areas to the high electric field gradient areas by dielectrophoresis when the field lines are configured diverging in the direction of first pad 3, as illustrated in FIGS. 3 and 7 to 11.

The electric field gradient is present at the surface of the area to be decontaminated and it is directed in such a way that the force imposed by the electric field drives the contaminants towards decontamination electrode 5. In the case of field lines diverging in the direction of first pad 3, the value of the electric field gradient increases in the direction of decontamination electrode 5, for example on the path between first pad 3 and the decontamination electrode in a direction parallel to the surface of the area to be decontaminated. The contaminants are concentrated in the areas where the electric field gradient is highest, for example next to certain parts of decontamination electrode 5.

In the case of converging electric field lines, the value of the gradient decreases and the contaminants are expelled from the areas where the gradient is high.

The first non-uniform electric field with diverging or converging field lines in the direction of the area to be decontaminated and with an electric field gradient parallel to the surface to be contaminated increasing or decreasing in the direction of the decontamination electrode can be obtained by a large number of means and with various configurations.

When first contact pad 3 forms part of the device for generating the first electric field, the latter and decontamination electrode 5 are for example configured for the first electric field to present electric field lines which diverge when directed towards the area to be decontaminated, i.e. which diverge from decontamination electrode 5 towards a part of first contact area 3 which is to be decontaminated. In this way, there is a progressive increase of the electric field when moving away from first contact area 3 towards decontamination electrode 5. The electric field gradient presents a component parallel to the surface of the pad so as to attract the contaminants out of pad 3. The contaminants then follow the surface of the substrate according to the electric field gradient so as to leave the area to be decontaminated or even to reach decontamination electrode 5.

The electric field must present diverging field lines at the surface of the contact area in order to force displacement of the contaminants. Even if diverging field lines exist originating from the lateral surfaces of the substrate, the latter do not have a direct effect on the contact surface. The field lines originating from the lateral surfaces can however serve the purpose of transporting the contaminants from contact pad 3 to decontamination electrode 5 along the substrate.

The electric field lines must be diverging or mainly diverging in a direction parallel to the contact surface so as to generate a movement of the contaminants which tends to make the latter leave contact pad 3. If the electric field is diverging in a direction perpendicular to the contact surface, the contaminants are blocked in a particular area of the contact surface at the place where the electric field gradient is highest.

A similar result can be obtained by means of a decontamination device generating electric field lines converging in the direction of first pad 3 in association with a suitable fluid. As illustrated in FIGS. 5 to 11, first pad 3 and decontamination electrode 5 can serve the purpose of forming diverging or converging electric field lines in the direction of the first pad. The fluid is then judiciously chosen such that the induced forces move the contaminants away from first pad 3.

In order to obtain the highest energy efficiency, the contact surface of first pad 3 is in the same plane as the part of decontamination electrode 5 which generates the, for example diverging, field lines. First pad 3 and decontamination electrode 5 are arranged at the surface of the substrate, preferably slightly salient from the surface of the substrate. The free surface of the decontamination electrode can be in the same plane as the contact surface of the first pad, but it can also be envisaged for the plane defined by the contact surface of the first pad to be above or below the part of decontamination electrode 5 which generates the diverging or converging field lines. The greater the height difference, the lower the parallel component, which reduces the efficiency of the decontamination electrode.

As illustrated in FIGS. 2 and 3, pad 3 and decontamination electrode 5 are in the same plane or substantially in the same plane located at the surface of the substrate. This preferred configuration enables a high level of decontamination to be achieved while at the same time maintaining the electric field below the breakdown value of the ambient environment.

Depending on the embodiments, the field lines diverge or converge from the electric field generating means to the part of the first contact pad to be decontaminated or from an electrode to the area to be decontaminated. The electric field presents electric field lines which diverge or converge at the level of a part of the contact surface of first contact pad 3 in the direction of the area to be decontaminated.

The electric field has a component in a direction parallel to the contact surface of first contact pad 3. This component enables the dielectric particles present at the surface of first contact pad 3 to be eliminated by dielectrophoresis. In the regions of the electric field where the field lines diverge from the generating means to the first contact pad, there is decontamination if the contaminant has a higher dielectric permittivity than the permittivity of the fluid. The non-uniform electric field generating means comprise a decontamination electrode 5 in immediate proximity to first contact pad 3. In the example of FIG. 3, two decontamination electrodes **5*a*, 5*b* are used. The contaminants are attracted to the areas having a high field gradient. As the field lines diverge when directed towards the area to be decontaminated, the impurities are removed from the area to be decontaminated and are concentrated in the high field gradient areas, here in proximity to electrodes 5***a* and 5*b* (FIG. 3).

The intensity and direction of the electric field are chosen such as to displace the contaminants to decontamination electrode 5, which enables first contact pad 3 to be decontaminated.

For example purposes, this non-uniform electric field enables the concentration of organic contaminants at the surface of first contact pad 3 to be reduced. Reducing the organic pollution at the surface of first contact pad 3 enables the reliability of the contact between first 3 and second 4 contact pads to be increased, reducing the risks of carbonization of these organic molecules.

Electrode 5, preferably in an annular shape, surrounds first contact pad 3. Annular electrode 5 is electrically distinct from first 3 and second 4 contact pads. Annular electrode 5 can be square, round or of any other shape. In preferential manner, the inner part of electrode 5 follows the shape of first contact pad 3 so as to have substantially complementary shapes. The decontamination electrode is preferably arranged around the area to be decontaminated, here around the first contact area, to form an electric field gradient around the area to be decontaminated. In the rest of the description, decontamination electrode 5 is considered as being annular, but other shapes can also be envisaged.

Depending on the embodiments, annular electrode 5 is continuous or discontinuous. The annular shape of electrode 5 protects first contact pad 3 from the outside environment by reducing the arrival of external contaminants.

Figure 5:
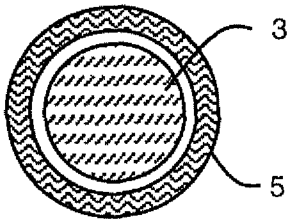
FIGS. 5 to 12 illustrate different associations of contact pads and decontamination electrodes, in schematic manner in top view.

In its embodiment called "continuous" illustrated for example in FIGS. 4 and 5, decontamination electrode 5 completely surrounds first contact pad 3 in a first sectional plane, here plane AA which is parallel to the contact surface.

Figure 6:
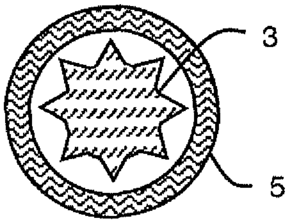

In the embodiment illustrated in FIGS. 5 and 6, the field lines are converging in the direction of first pad 3. The space arranged between first pad 3 and decontamination electrode 5 is filled by a fluid having a higher permittivity than the permittivity of the supposed contamination. As the permittivity of the contamination is lower than the permittivity of the ambient environment and the field lines converge in the direction of pad 3, dielectrophoresis generates a force on the contaminant enabling decontamination of pad 3. In this example case, the space between decontamination electrode 5 and pad 3 can be filled for example by pure water or by formic acid or another material compatible with operation of the moving arm. For example, it is possible to at least partially immerse the device in a bath of pure water or formic acid.

Figure 7:
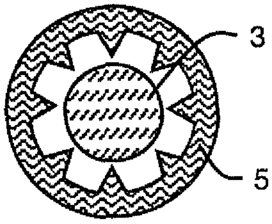
Figure 8:
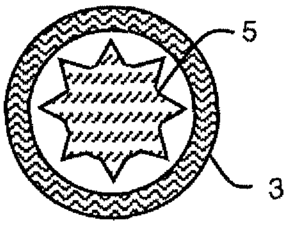
Figure 9:
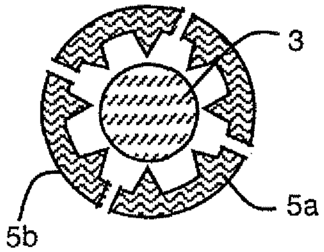

In the privileged embodiments illustrated in FIGS. 7 to 9, the electric field is non-uniform with field lines diverging in the direction of pad 3. The space arranged between first pad 3 and decontamination electrode 5 is filled by a fluid having a lower permittivity than the permittivity of the supposed contamination. As the permittivity of the contamination is higher than the permittivity of the ambient environment and the field lines converge in the direction of decontamination electrode 5, dielectrophoresis generates a force on the contaminant enabling decontamination of pad 3. These embodiments provide a very great flexibility in the choice of the material that is able to be decontaminated and also in the material that separates decontamination electrode 5 from pad 3. In this example case, the fluid is advantageously a gas. The fluid used can be air or a low-pressure atmosphere.

In the embodiments illustrated in FIG. 8, contact area 3 surrounds decontamination electrode 5 which enables the contaminants to be concentrated inside the surface defined by the contact area in order to achieve decontamination without any loss of space on the substrate.

In its embodiment called "discontinuous" illustrated in FIGS. 8 and 9, decontamination electrode (here annular) 5 partially surrounds first contact pad 3. Annular electrode 5 surrounds first contact pad 3, but it leaves one or more angular sectors facing nothing between annular electrode 5 and first contact pad 3. Annular electrode 5 can therefore be formed by a plurality of elementary electrodes arranged at a distance from one another. There is then an alternation of angular sectors facing material and of angular sectors facing nothing. In these embodiments, the contact area acts as a counter-electrode in application of the electric field.

In a particular embodiment, the maximum electric field between annular electrode 5 and first contact pad 3 is greater than or equal to one kilovolt per centimeter (kV/cm).

The decontamination effect is all the greater the higher the value of the electric field. However, the maximum electric field is limited by the breakdown of the environment in which the electric field is formed. For example, for air, the maximum is about 10 to 80 kV/cm. In preferential manner, the electric field is essentially oriented in a direction parallel to the contact surface between the first and second contact pads in order to have the maximum energy efficiency for decontamination. The higher the field gradient, the more efficient decontamination is.

In a preferred embodiment, the distance between electrode 5 and first contact pad 3 is not constant, which enables a non-homogeneous electric field to be obtained. In a first case illustrated in FIG. 6, contact pad 3 presents one or more salient areas in the direction of decontamination electrode 5.

In another case illustrated in FIG. 7, electrode 5 presents one or more salient areas in the direction of first contact pad 3 and more particularly in the direction of the area to be decontaminated. In an identical configuration illustrated in FIG. 8 inverting the positions of contact surface and electrode 5, electrode 5 presents one or more salient areas in the direction of first contact pad 3. This salient area enables the field lines of the electric field gradient present between electrode 5 and first contact pad 3 to be concentrated and the required divergence in the field lines to be obtained. To obtain this result, first contact pad 3 and/or annular electrode 5 can present any shape, for example a star-shape or the shape of a cog-wheel.

In yet a further embodiment which can be combined with the previous embodiments, a bias variable with time is applied between electrode 5 and first contact pad 3. This modulation in time enables the shape of the gradient to be modified and facilitates decontamination in certain areas. This also makes it possible to select certain species to be decontaminated. Modulation in time can serve the purpose of creating stationary waves, which enables creation of an electric field that is more independent from the geometry of the electrodes. The device can comprise means for applying a bias variable with time between electrode 5 and contact pad 3. This implementation is particularly interesting in the embodiment illustrated in FIGS. 9 and 10 with several elementary electrodes 5.

Figure 10:
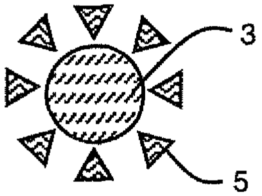
Figure 11:
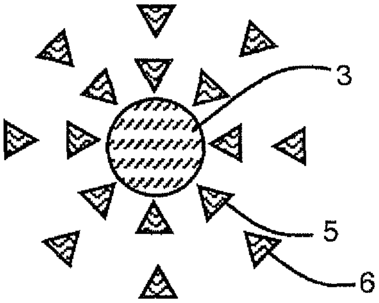

When electrode 5 is formed by a plurality of elementary electrodes as illustrated in FIGS. 9 to 11, the different electrodes can be subjected to the same potential or to different potentials so as to obtain the required electric field gradient. Preferably, a non-uniform electric field gradient also exists between adjacent elementary electrodes so as to capture the particles which pass between the two elementary electrodes.

The decontamination device is configured to apply the non-uniform first electric field between first contact pad 3 and first decontamination electrode 5 and a second non-uniform electric field on at least a second part of the contact area of first pad 3 by means of a second decontamination electrode 5*b*. A second fluid is arranged between first contact pad 3 and second decontamination electrode 5. The second fluid has a second permittivity value which can be equal to or different from that of the first fluid.

The decontamination device and the second fluid are configured in such a way that the second electric field generates a force directed towards the decontamination electrode 5*b* on the contaminant, by dielectrophoresis.

It is then possible to have converging electric field lines between pad 3 and one of decontamination electrodes 5 and diverging electric field lines between pad 3 and the other decontamination electrode 5.

In another alternative embodiment able to be illustrated in FIGS. 9 to 11, electrode 5 comprises or is formed by an electret or by a plurality of electrets. In this example case, a voltage source is not necessary as the electrets have an intrinsic electric bias. The use of electrets is particularly interesting when the device is disconnected from its power source as the contaminant particles continue to undergo the effect of the electric field.

In another embodiment able to be illustrated in FIGS. 9 to 11, several decontamination electrodes or several series of decontamination electrodes are associated with a contact pad 3. These different decontamination electrodes can be electrically independent to take account of the flux of contaminant around the pad or of defects in fabrication. In the illustrated embodiments, electrodes 5 are arranged around pad 3 but it is also possible to reverse the positions of these elements or to use an embodiment according to FIGS. 5 and 6.

In the embodiment illustrated in FIG. 11, the device advantageously comprises a circuit for applying a first electric field between pad 3 and the closest decontamination electrode 5 or a group of closest electrodes and a second electric field between decontamination electrode 5 (or group of electrodes) and a second decontamination electrode 5 (or a second group of electrodes) located farther away. The device for applying the first non-uniform electric field and the second non-uniform electric field is configured to apply the first electric field and then the second electric field, with a time stagger, so as to at least partially decontaminate first contact pad 3 and to then displace the contaminants to the second decontamination electrode.

In this way, it is possible during a first period to perform decontamination of pad 3 by means of first electrode or of the first series of electrodes and to then transfer the contaminants from the first electrode (or first series of electrodes) to the second electrode (or second series of electrodes). The first and second decontamination electrodes can be aligned with the pad. The first electrode can have a different shape from the second electrode and/or be made from different materials. For example, the first electrode is advantageously discontinuous and the second electrode is formed by a series of elementary electrodes, but it is also possible to have an opposite organization. In a preferred embodiment, decontamination electrode 5 is embedded in the substrate in order to limit the height of its part that is salient with respect to the surface of the substrate. In even more preferred manner, the top surface of decontamination electrode 5 is in the same plane as the surface of the substrate in order not to hinder displacement of the contaminants.

Figure 12:
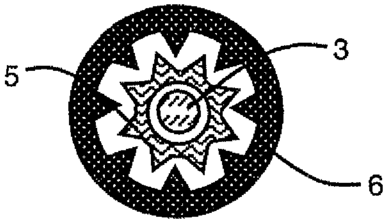

In an alternative embodiment illustrated in FIG. 12 and which can be applied to the previous embodiments, an additional electrode 6 is provided in proximity to electrode 5. Additional electrode 6 is for example arranged around first contact pad 3 and the decontamination electrode. In preferred manner, the two electrodes 5 and 6 are of annular type, but it is possible to combine an annular electrode with a non-annular electrode. It is also possible to use an electrode comprising one or more electrets or formed by a plurality of electrets in combination with an electrode which is devoid thereof. In an advantageous embodiment, electrodes 5 and 6 are annular and concentric with additional electrode 6 preferably around decontamination electrode 5. In even more advantageous manner, first contact pad 3 is arranged in the center of the two annular electrodes 5 and 6.

The pair formed by pad 3 and decontamination electrode 5 is the one that is illustrated in FIG. 5, but the other embodiments are also possible. The first electric field is applied as in the foregoing to perform decontamination. A second electric field is also applied. This second electric field is non-uniform with a divergence in the direction of the decontamination electrode so as to achieve decontamination of electrode 5 by additional electrode 6. In this way, new contaminants are prevented from approaching electrode 5 by concentrating them on additional electrode 6. It is also possible to have a second electric field with a divergence in the direction of the additional electrode. It is further possible to have a combination of these two embodiments as illustrated in FIG. 12.

In this embodiment, it is preferable to integrate means for generating a high electric field gradient between the two electrodes 5 and 6 compared with the electric field present between electrode 5 and the contact surface to be decontaminated of first contact pad 3. This additional annular electrode 6 associated with a higher electric field gradient enables the polluting particles to be concentrated between these two electrodes 5 and 6. The device for generating the non-uniform electric field comprises the additional electrode and the decontamination electrode and the surface to be decontaminated is the surface situated between the two electrodes 5 and 6.

This architecture also makes it possible not to impose a decontaminant electric field between pad 3 and decontamination electrode 5, for example by applying the same potential to pad 3 and decontamination electrode 5. The decontaminant electric field is then applied between decontamination electrode and additional electrode 6.

The contaminant molecules are concentrated between the two annular electrodes 5 and 6, which further enables an increased displacement of these molecules away from first contact pad 3 to be obtained on account of the concentration difference that exists between first contact pad 3 and electrode 5. Although first pad 3 is not subjected to the electric field gradient of additional electrode 6, a contaminant depletion does in fact occur in proximity to first pad 3. Homogenization of the concentration of contaminant on the surface of the substrate will result in decontamination of the surface of first pad 3. The best results are obtained with annular electrodes which form a shield around the first pad.

In a preferred embodiment, an anti-adhesive coating is formed at the surface of the substrate, between first contact area 3 and the means for generating the non-uniform electric field, preferably between the first contact area and decontamination electrode 5. This anti-adhesive coating can be obtained by means of deposition of a suitable material or by means of a specific surface treatment, for example by plasma or liquid means. In preferential manner, a chemical treatment leaving a grafting of silane-termination polytetrafluoro-ethylene molecules at the surface is used.

First contact pad 3 and second contact pad 4 are formed by an electrically conducting material, preferably a metal material. Electrodes 5 and 6 are formed by an electrically conducting material, preferably a metal material or by a synthetic polymer such as polypropylene, polyethylene terephtalate in the case of the electrets. It is also possible to form electrets in a silicon oxide which is used in the device. Electrodes 5 and 6 can also be covered by an insulating material.

In order to obtain maximum decontamination of first contact pad 3, the contact surface of the latter is at the same level or salient from the immediate surrounding surface. Furthermore, the plane containing annular electrode 5 also contains first contact pad 3.

In another embodiment, another electrode is also formed close to second contact pad 4, preferably around second contact pad 4, in order to facilitate decontamination of the latter. The different alternative embodiments presented for first contact pads 3 can be used for second contact pad 4.

If second contact pad 4 makes an electric connection between first contact pad 3 and an adjacent pad (not shown), annular electrode 5 can surround the first contact pad or both the contact pads. It can also be envisaged to use two joined annular electrodes for example in the shape of a figure-of-eight.

Depending on the embodiments, the non-uniform electric field can be obtained by means of first contact area 3 and by a decontamination electrode 5 or by means of two or more decontamination electrodes 5 or by any other suitable technique.

The invention claimed is:

1. A device comprising a substrate having a first contact pad with a contact area, a second contact pad with a contact area, the second contact pad integral to the substrate and comprising a contact area, moving with respect to the first contact pad between an ohmic contact position between said contact areas and another position, a decontamination device configured to apply a first non-uniform electric field on at least a part of the contact area of the first pad by means of a decontamination electrode, a fluid arranged between the first contact pad and the decontamination electrode, the fluid having a first dielectric permittivity value, wherein the decontamination device and the fluid are configured in such a way that the first electric field generates a force directed towards the decontamination electrode on a contaminant, by dielectrophoresis.

2. The device according to claim 1, wherein the first dielectric permittivity value of the fluid is lower than the dielectric permittivity value of the contaminant, the decontamination device being configured in such a way that the electric field comprises electric field lines, on the contact surface of the first contact area, converging in the direction of the decontamination electrode with an increasing electric field gradient in the direction of the decontamination electrode.

3. The device according to claim 1, wherein the decontamination electrode comprises at least one area salient in the direction of the first contact pad.

4. The device according to claim 1, wherein the first dielectric permittivity value of the fluid is greater than the dielectric permittivity value of the contaminant, the decontamination device being configured in such a way that the electric field comprises electric field lines, on the contact surface of the first contact area, diverging in the direction of the decontamination electrode with a decreasing electric field gradient in the direction of the decontamination electrode.

5. The device according to claim 1, wherein the decontamination electrode is arranged around the first contact area.

6. The device according to claim 1, wherein the decontamination electrode comprises a plurality of elementary electrodes electrically connected to the first terminal of a bias circuit.

7. The device according to claim 1, wherein the decontamination device is configured to apply a second non-uniform electric field on at least a second part of the contact area of the first pad by means of a second decontamination electrode, a second fluid being arranged between the first contact pad and the second decontamination electrode, the fluid having a second dielectric permittivity value, the decontamination device and the second fluid being configured in such a way that the second electric field generates a force directed towards the second decontamination electrode on the contaminant, by dielectrophoresis.

8. The device according to claim 7, wherein the decontamination device is configured to apply a second non-uniform electric field that is higher than the first non-uniform electric field.

9. The device according to claim 1, wherein the decontamination device is configured to apply a second non-uniform electric field on at least a part of the decontamination electrode by means of a second decontamination electrode, the second fluid being arranged between the second decontamination electrode and the decontamination electrode, the fluid having a second dielectric permittivity value, the decontamination device and the second fluid being configured in such a way that the second electric field generates a force directed towards the second decontamination electrode on the contaminant to move the contaminant away from the first contact pad, by dielectrophoresis.

10. The device according to claim 9, wherein the decontamination device is configured to apply a second non-uniform electric field with a time stagger with respect to the first non-uniform electric field so as to at least partially decontaminate the first contact pad by means of the decontamination electrode and to then displace the contaminants to the second decontamination electrode.

11. The device according to claim 1, wherein the decontamination electrode and/or the second decontamination electrode comprises at least one electret.

12. The device according to claim 1, wherein the substrate is covered by an anti-adhesive coating between the first contact area and the decontamination electrode.

13. The device according to claim 1, wherein the decontamination electrode is formed in the substrate in such a way that the top surface of the decontamination electrode is in the same plane as the surface of the substrate.

14. A device comprising:

a substrate having a first contact pad with a contact area, a second contact pad integral to the substrate and comprising a contact area, the second contact pad moving with respect to the first contact pad between an ohmic contact position between said contact areas and another position, a decontamination electrode arranged on the substrate and surrounding the first contact pad, an additional electrode arranged on the substrate and surrounding the a decontamination electrode, a decontamination device configured to apply a first non-uniform electric field between a decontamination electrode and the additional electrode, the decontamination device being configured in such a way that the first electric field comprises diverging or converging electric field lines in the direction of the additional electrode with an electric field gradient increasing or decreasing in the direction of the decontamination electrode along the surface of the substrate separating the decontamination electrode from the additional electrode.

15. The device according to claim 14 wherein the decontamination electrode comprises at least one area salient in the direction of the additional electrode.

16. The device according to claim 14 wherein the additional electrode comprises at least one area salient in the direction of the decontamination electrode.

17. The device according to claim 14, wherein the decontamination electrode comprises a plurality of elementary electrodes electrically connected to a first terminal of a bias circuit.

* * * * *